United States Patent
Hashimoto et al.

(10) Patent No.: US 8,238,137 B2
(45) Date of Patent: Aug. 7, 2012

(54) FERROELECTRIC RANDOM ACCESS MEMORY DEVICE

(75) Inventors: Daisuke Hashimoto, Yokohama (JP); Daisaburo Takashima, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 203 days.

(21) Appl. No.: 12/562,051

(22) Filed: Sep. 17, 2009

(65) Prior Publication Data
US 2010/0110755 A1 May 6, 2010

(30) Foreign Application Priority Data
Nov. 4, 2008 (JP) ................................ 2008-283088

(51) Int. Cl.
*G11C 11/22* (2006.01)
(52) U.S. Cl. ........ 365/145; 365/202; 365/207; 365/205; 365/196; 365/189.15
(58) Field of Classification Search .................. 365/145, 365/49.13, 196, 205, 207, 202, 189.05, 189.15
See application file for complete search history.

(56) References Cited

U.S. PATENT DOCUMENTS

| 5,903,492 A | 5/1999 | Takashima | |
| 6,151,242 A * | 11/2000 | Takashima | ................... 365/145 |
| 7,092,274 B2 * | 8/2006 | Hoya et al. | ..................... 365/145 |
| 2002/0015325 A1 | 2/2002 | Maruyama | |
| 2008/0180984 A1 * | 7/2008 | Takashima et al. | ........... 365/145 |
| 2009/0231903 A1 * | 9/2009 | Ogiwara et al. | .............. 365/145 |

FOREIGN PATENT DOCUMENTS

| JP | 2002-093156 | 3/2002 |
| JP | 2002-093156 A | 3/2002 |

OTHER PUBLICATIONS

H. Shiga, et al., "A 1.6GB/s DDR2 128Mb Chain FeRAM with Scalable Octal Bitline and Sensing Schemes", ISSCC Dig. Tech Papers, pp. 464-465, Feb. 2009.
K. Hoya et al., "A 64Mb Chain FeRAM with Quad-BL Architecture and 200MB/s Burst Mode", ISSCC Dig Tech. Papers, pp. 459-466, Feb. 2009.
Explanation of Non-English Language References.

* cited by examiner

*Primary Examiner* — Vu Le
*Assistant Examiner* — Han Yang
(74) *Attorney, Agent, or Firm* — Knobbe Martens Olson & Bear LLP

(57) ABSTRACT

A ferroelectric random access memory device has a first bit line, a first ferroelectric capacitor, a second bit line, a second ferroelectric capacitor and a first to fourth MOS transistor. The first bit line is changed to a first data potential according to first data stored in the first ferroelectric capacitor, the second bit line is changed to a second data potential according to second data obtained by inverting a logic of the first data, and then the second MOS transistor and the fourth MOS transistor are turned on.

16 Claims, 6 Drawing Sheets

FERROELECTRIC RANDOM ACCESS MEMORY DEVICE

CROSS-REFERENCE TO RELATED APPLICATION

This application is based upon and claims the benefit of priority from the prior Japanese Patent Application No. 2008-283088, filed on Nov. 4, 2008, the entire contents of which are incorporated herein by reference.

BACKGROUND OF THE INVENTION

1. Field of the Invention

The present invention relates to a ferroelectric random access memory (FeRAM) device.

2. Background Art

In recent years, ferroelectric random access memory (FeRAM) devices using ferroelectric capacitors have received attention as a kind of nonvolatile semiconductor memory.

In a ferroelectric random access memory device of the prior art, a predetermined potential is applied to one end of a ferroelectric capacitor based on the output of read information from a sense amplifier when information is read from a memory cell and then rewriting is performed again on the memory cell (for example, see Japanese Patent Laid-Open No. 2002-93156).

With this configuration, the ferroelectric random access memory device switches the potential of a plate line for rewriting from a power supply potential to a ground potential immediately after the information is read by the sense amplifier. In other words, the cycle of the reading operation of a ferroelectric random access memory is shortened in the ferroelectric random access memory device.

SUMMARY OF THE INVENTION

According to one aspect of the present invention, there is provided: a ferroelectric random access memory device, comprising:

a first bit line;

a second bit line;

a first ferroelectric capacitor connected between the first bit line and a first plate line, and storing data according to an first applied voltage and a polarization state determined by a polarity of the first applied voltage;

a second ferroelectric capacitor connected between the second bit line and a second plate line, and storing data according to an second applied voltage and a polarization state determined by a polarity of the second applied voltage;

a sense amplifier connected between the first bit line and the second bit line, and amplifying a potential difference between the first bit line and the second bit line;

a first output terminal;

a second output terminal;

a first output line comprising one end connected to a power supply and an other end connected to the first output terminal;

a second output line comprising one end connected to the power supply and an other end connected to the second output terminal;

a first Metal Oxide Semiconductor (MOS) transistor connected between the first output line and ground, and comprising a gate connected to the first bit line;

a second MOS transistor connected in series with the first MOS transistor between the first output line and the ground;

a third MOS transistor connected between the second output line and the ground, and comprising a gate connected to the second bit line; and a fourth MOS transistor connected in series with the third MOS transistor between the second output line and the ground, wherein the first bit line is changed to a first data potential according to first data stored in the first ferroelectric capacitor, the second bit line is changed to a second data potential according to second data obtained by inverting a logic of the first data, and then the second MOS transistor and the fourth MOS transistor are turned on.

According to another aspect of the present invention, there is provided: a ferroelectric random access memory device, comprising:

a first bit line;

a second bit line;

a first ferroelectric capacitor connected between the first bit line and a first plate line, and storing data according to an first applied voltage and a polarization state determined by a polarity of the first applied voltage;

a second ferroelectric capacitor connected between the second bit line and a second plate line, and storing data according to an second applied voltage and a polarization state determined by a polarity of the second applied voltage;

a sense amplifier connected between the first bit line and the second bit line, and amplifying a potential difference between the first bit line and the second bit line;

a first output terminal;

a second output terminal;

a first output line connected to the first output terminal;

a second output line connected to the second output terminal;

a first Metal Oxide Semiconductor (MOS) transistor connected between the first output line and a control line, and comprising a gate connected to the first bit line; and a second MOS transistor connected between the first output line and the control line, and comprising a gate connected to the second bit line, wherein, in a state in which a potential of the control line is set at a first control potential, the first bit line is changed to a first data potential according to first data stored in the first ferroelectric capacitor, the second bit line is changed to a second data potential according to second data obtained by inverting a logic of the first data, and then the potential of the control line is changed from the first control potential to a second control potential lower than the first control potential.

DETAILED DESCRIPTION

COMPARATIVE EXAMPLE

As a comparative example, the following will examine characteristics in the reading operation of a ferroelectric random access memory device according to the prior art.

Figure 1:
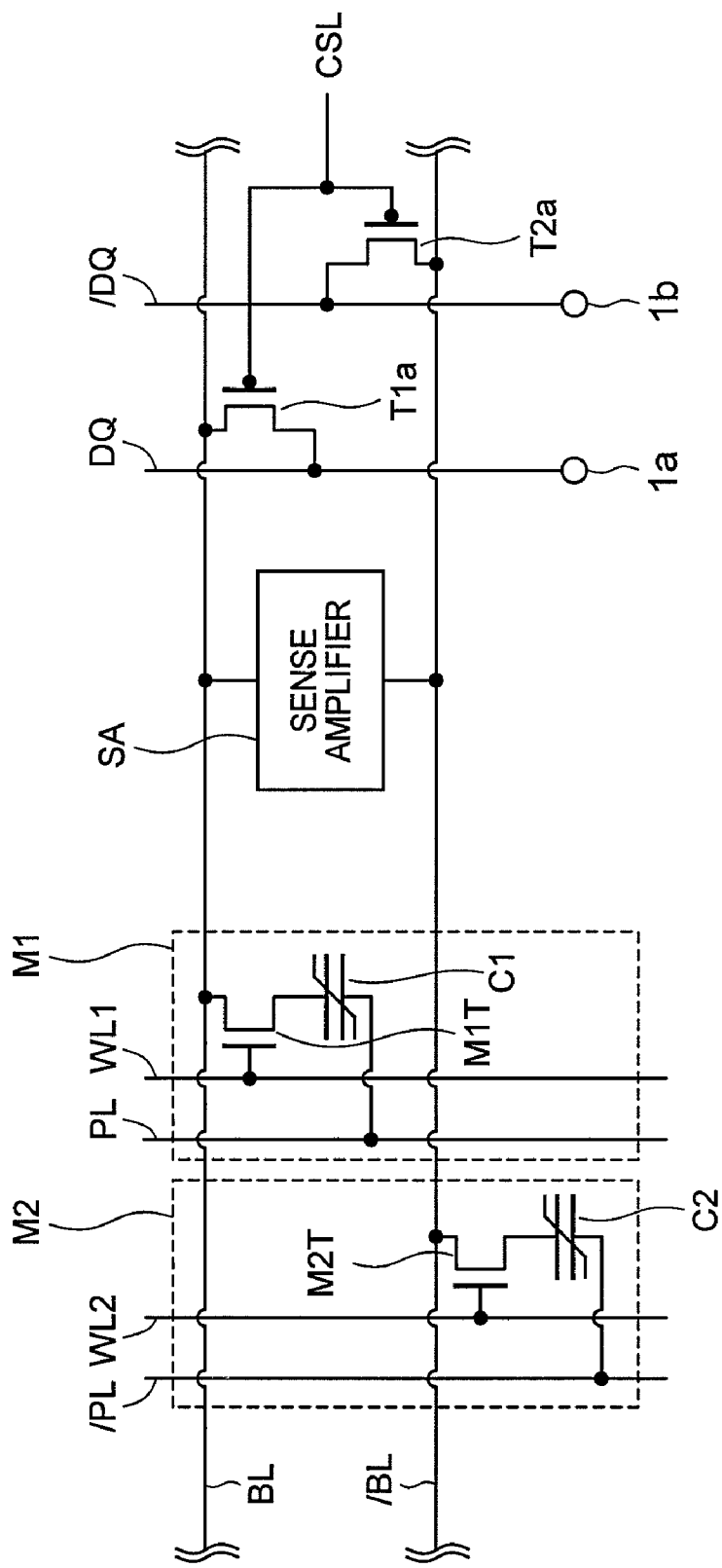
FIG. 1 is a circuit diagram showing an example of the configuration of a ferroelectric random access memory device 100a according to the comparative example.
Figure 2:
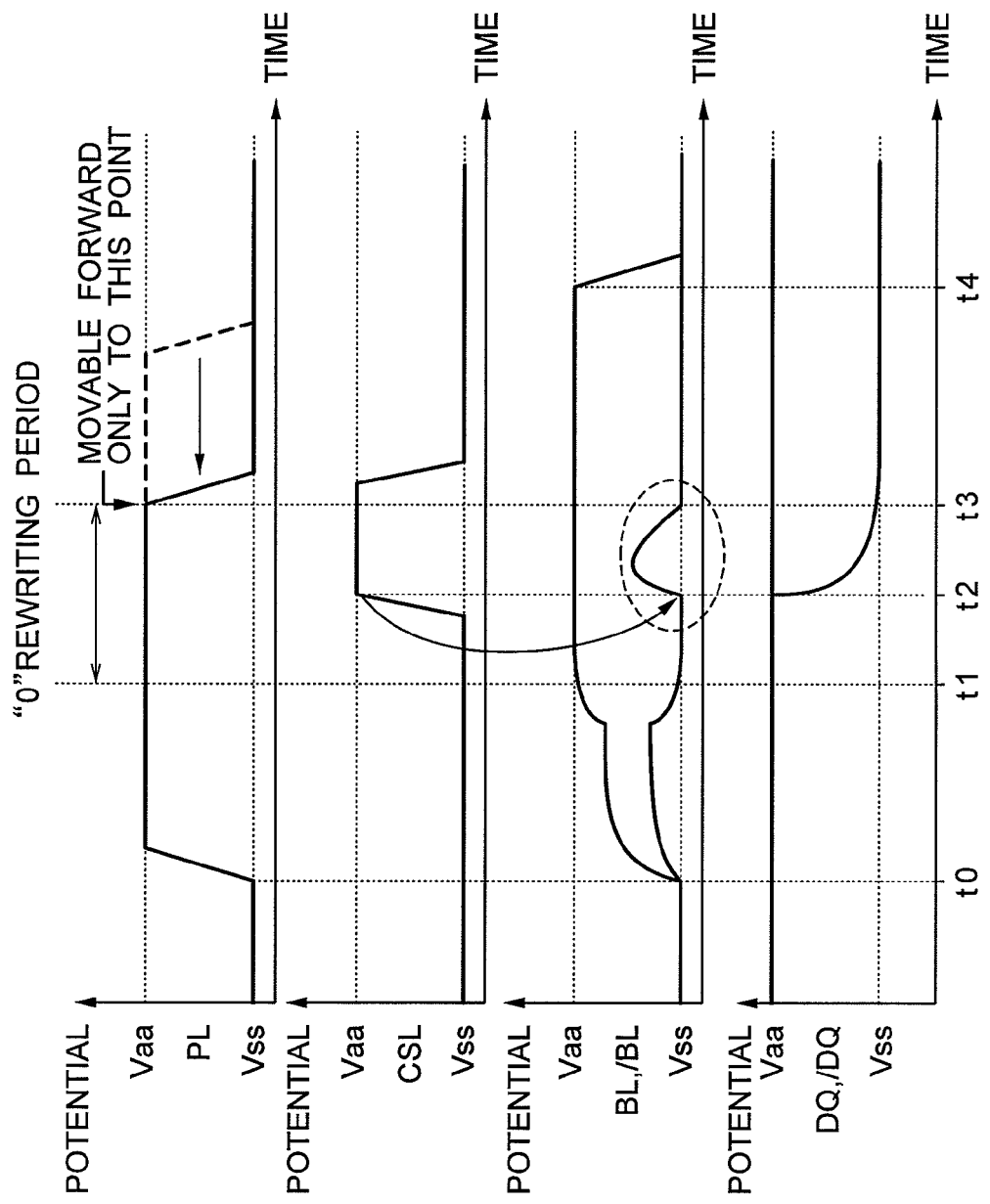
FIG. 2 is a timing chart of the waveforms in the cycle of the reading operation of the ferroelectric random access memory device 100a shown in FIG. 1.

FIG. 1 is a circuit diagram showing an example of the configuration of a ferroelectric random access memory device 100a according to the comparative example. FIG. 2 is a timing chart of the waveforms in the cycle of the reading operation of the ferroelectric random access memory device 100a shown in FIG. 1.

First, by controlling the potentials of plate lines PL and /PL and word lines WL1 and WL2 in the ferroelectric random access memory device 100a of FIG. 1, potentials corresponding to data stored in memory cells M1 and M2 are read by bit lines BL and /BL (in FIG. 2, at time t0). At this point, in the memory cell fed with a voltage in a direction along which inverted data is written, the stored data is corrupted. However, the data corrupted by the reading is recovered by rewriting "1", which will be described later.

Next, a sense amplifier SA amplifies a potential difference between the bit lines BL and /BL to a predetermined level (in FIG. 2, at time t1).

After that, by raising the potential of a control line CSL, nMOS (Metal Oxide Semiconductor) transistors T1a and T2a are turned on and the potentials of the bit lines BL and /BL are transmitted to output lines DQ and /DQ (in FIG. 2, at time t2).

At this point, the output lines DQ and /DQ have been precharged to a power supply potential Vaa beforehand (in FIG. 2, until time t2).

Thus when the potential of the bit line BL is a ground potential Vss and the potential of the bit line /BL is the power supply potential Vaa, the output line DQ is discharged to the ground potential Vss at time t2. When the potential of the bit line BL is the power supply potential Vaa and the potential of the bit line /BL is the ground potential Vss, the output line /DQ is discharged to the ground potential Vss. The potentials of the output lines DQ and /DQ are outputted from output terminals 1a and 1b as signals corresponding to the data read from the memory cells M1 and M2.

Further, by driving the sense amplifier SA, the bit lines BL and /BL are respectively controlled to the power supply potential Vaa and the ground potential Vss or to the ground potential Vss and the power supply potential Vaa and "0" is rewritten in a period (in FIG. 2, from time t1 to time t3) during which the potentials of the plate lines PL and /PL are at "High" level.

After that, for example, when the potentials of the plate lines PL and /PL are reduced to the ground potential Vss in a state in which the sense amplifier SA is driven, rewriting of "1" is started (in FIG. 2, from time t3). Rewriting of "1" continues until the sense amplifier SA is deactivated and the bit lines BL and /BL are both reduced to Vss.

As described above, the reading cycle of the ferroelectric random access memory device is made up of three independent operations of reading, rewriting of "0", and rewriting of "1".

In some cases, the sense amplifier SA and the bit lines BL and /BL have smaller capacitances than the output lines DQ and /DQ and the influence of the smaller capacitances is not negligible. In this case, for example, when the output line DQ (/DQ) is discharged to the ground potential Vss, the potential of the bit line BL (/BL) temporarily rises from the ground potential Vss (in a range surrounded by a dotted line in FIG. 2, from time t2 to time t3).

At this point (from time t2 to time t3), if the potentials of the plate lines PL and /PL are reduced to the ground potential Vss, inverted data ("1") may be erroneously written in the memory cell ("0" has been written before reading) connected to the bit line at the ground potential Vss.

The potential of the plate line PL is reduced to the ground potential Vss at least after the potential of the bit line BL (/BL) is stabilized to the ground potential Vss. By the way, the data corrupted in the reading operation is "1" data which requires polarization inversion in reading, and "0" data is not corrupted. Thus a rewriting time for "0" data is not necessary in theory. However, since the potential of the bit line temporarily rises, it is not possible to advance the timing of the reduction in the potential of the plate line PL to the ground potential Vss, so that the cycle of the reading operation of the ferroelectric random access memory cannot be further shortened.

In the following embodiments, ferroelectric random access memory devices are proposed which can further shorten the cycle of the reading operation of a ferroelectric random access memory.

The embodiments to which the present invention is applied will be described below with reference to the accompanying drawings.

[First Embodiment]

Figure 3:
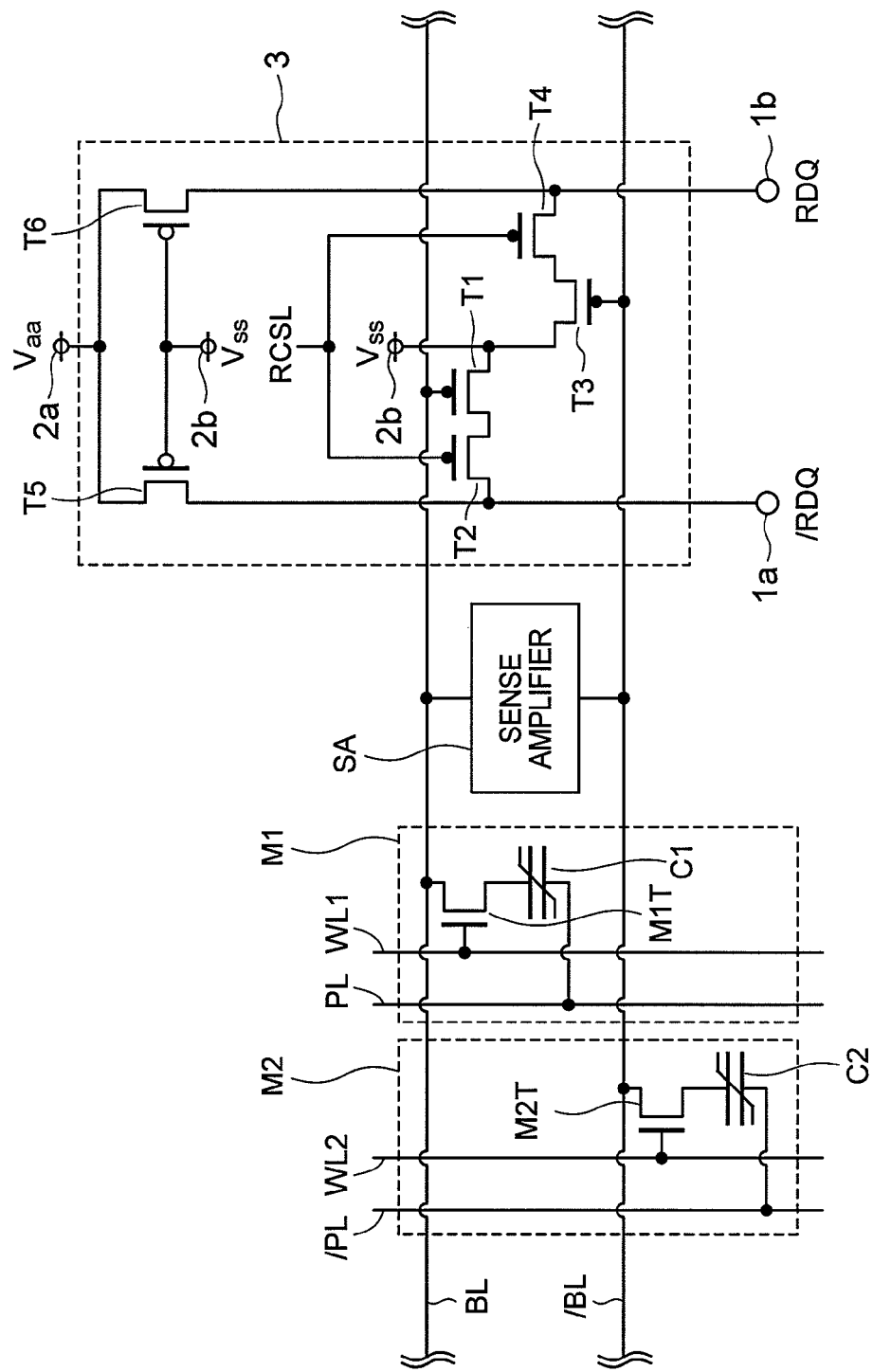
FIG. 3 is a circuit diagram showing an example of the configuration of a ferroelectric random access memory device 100 according to a first embodiment of the present invention.

FIG. 3 is a circuit diagram showing an example of the configuration of a ferroelectric random access memory device 100 according to a first embodiment of the present invention.

As shown in FIG. 3, the ferroelectric random access memory device 100 includes a first output terminal 1a and a second output terminal 1b, a first bit line BL, a second bit line /BL, a first memory cell M1, a second memory cell M2, a sense amplifier SA, and a reading circuit 3.

The first memory cell M1 includes a first ferroelectric capacitor C1 and a first selecting MOS transistor M1T.

The first ferroelectric capacitor C1 is connected between the first bit line BL and a first plate line PL. In other words, in the present embodiment, one of the electrodes of the first ferroelectric capacitor C1 is connected to the first bit line BL via the first selecting MOS transistor M1T. Further, the other electrode of the first ferroelectric capacitor C1 is connected to the first plate line PL.

The first ferroelectric capacitor C1 stores data according to a voltage applied between the two electrodes and a polarization state determined by the polarity of the voltage. By setting the potential of a first word line WL1 at "High" level, the first selecting MOS transistor M1T is turned on and the first bit line BL and the one of the electrodes of the first ferroelectric capacitor C1 are electrically connected to each other. The potential of the first plate line PL is controlled in this state, so that a potential corresponding to the data stored in the first ferroelectric capacitor C1 is applied to the first bit line BL.

The second memory cell M2 includes a second ferroelectric capacitor C2 and a second selecting MOS transistor M2T.

The second ferroelectric capacitor C2 is connected between the second bit line /BL and a second plate line /PL. In other words, in the present embodiment, one of the electrodes of the second ferroelectric capacitor C2 is connected to the second bit line /BL via the second selecting MOS transistor M2T. Further, the other electrode of the second ferroelectric capacitor C2 is connected to the second plate line /PL.

The second ferroelectric capacitor C2 stores data according to a voltage applied between the two electrodes and a polarization state determined by the polarity of the voltage. By setting the potential of a second word line WL2 at "High" level, the second selecting MOS transistor M2T is turned on and the second bit line /BL and the one of the electrodes of the second ferroelectric capacitor C2 are electrically connected to each other. The potential of the second plate line /PL is controlled in this state, so that a potential corresponding to the data stored in the second ferroelectric capacitor C2 is applied to the second bit line /BL.

The sense amplifier SA is connected between the first bit line BL and the second bit line /BL. The sense amplifier SA amplifies a potential difference between the first bit line BL and the second bit line /BL.

The reading circuit 3 includes a first MOS transistor T1, a second MOS transistor T2, a third MOS transistor T3, a fourth MOS transistor T4, a fifth MOS transistor T5, a sixth MOS transistor T6, a control line RCSL, a first output line /RDQ, and a second output line RDQ.

The first output line /RDQ has one end connected to a power supply 2a and the other end connected to the first output terminal 1a.

The second output line RDQ has one end connected to the power supply 2a and the other end connected to the second output terminal 1b.

The first MOS transistor T1 is connected between the first output line /RDQ and ground 2b and has the gate connected to the first bit line BL.

The second MOS transistor T2 is connected in series with the first MOS transistor T1 between the first output line /RDQ and the ground 2b.

By connecting the first MOS transistor T1 to the ground 2b, it is possible to further suppress capacitive coupling between the first bit line BL and the first output line /RDQ.

The third MOS transistor T3 is connected between the second output line RDQ and the ground 2b and has the gate connected to the second bit line /BL.

The fourth MOS transistor T4 is connected in series with the third MOS transistor T3 between the second output line RDQ and the ground 2b.

By connecting the third MOS transistor T3 to the ground 2b, it is possible to further suppress capacitive coupling between the second bit line /BL and the second output line RDQ.

In this configuration, the first to fourth MOS transistors T1 to T4 are n-type MOS transistors. When necessary, the first to fourth MOS transistors T1 to T4 may be p-type MOS transistors.

The p-type fifth MOS transistor T5 is connected between the power supply 2a and the first output line /RDQ and has the gate connected to the ground 2b.

The p-type sixth MOS transistor T6 is connected between the power supply 2a and the second output line RDQ and has the gate connected to the ground 2b.

In other words, the fifth and sixth MOS transistors T5 and T6 act as resistors.

The fifth MOS transistor T5 and the sixth MOS transistor T6 are equal in size. While the control line RCSL has a ground potential Vss, the second and fourth MOS transistors T2 and T4 are turned off and the first and second output lines /RDQ and RDQ are precharged to a power supply potential Vaa with an equal driving force.

The first and third MOS transistors T1 and T3 are controlled to be turned on/off according to the potentials of the first and second bit lines BL and /BL. When a predetermined potential difference occurs between the first and second bit lines BL and /BL, only one of the first and third MOS transistors T1 and T3 is turned on. The second and fourth MOS transistors T2 and T4 are turned on by applying a control signal to the control line RCSL, so that one of the first and second output lines /RDQ and RDQ is electrically connected to the ground 2b and the electrically connected output line is discharged to the ground potential Vss.

The first to fourth MOS transistors T1 to T4 are larger in size than the fifth and sixth MOS transistors T5 and T6. Thus a driving force for discharging the first output line /RDQ and the second output line RDQ is larger than the driving force for the precharge, and the potential of the output line can be properly reduced to the ground potential Vss by the discharge. The larger the first to fourth transistors T1 to T4 as compared with the fifth and sixth transistors T5 and T6, the shorter the time for discharge.

The following will describe an example of the reading operation of the ferroelectric random access memory device 100 configured thus.

Figure 4:
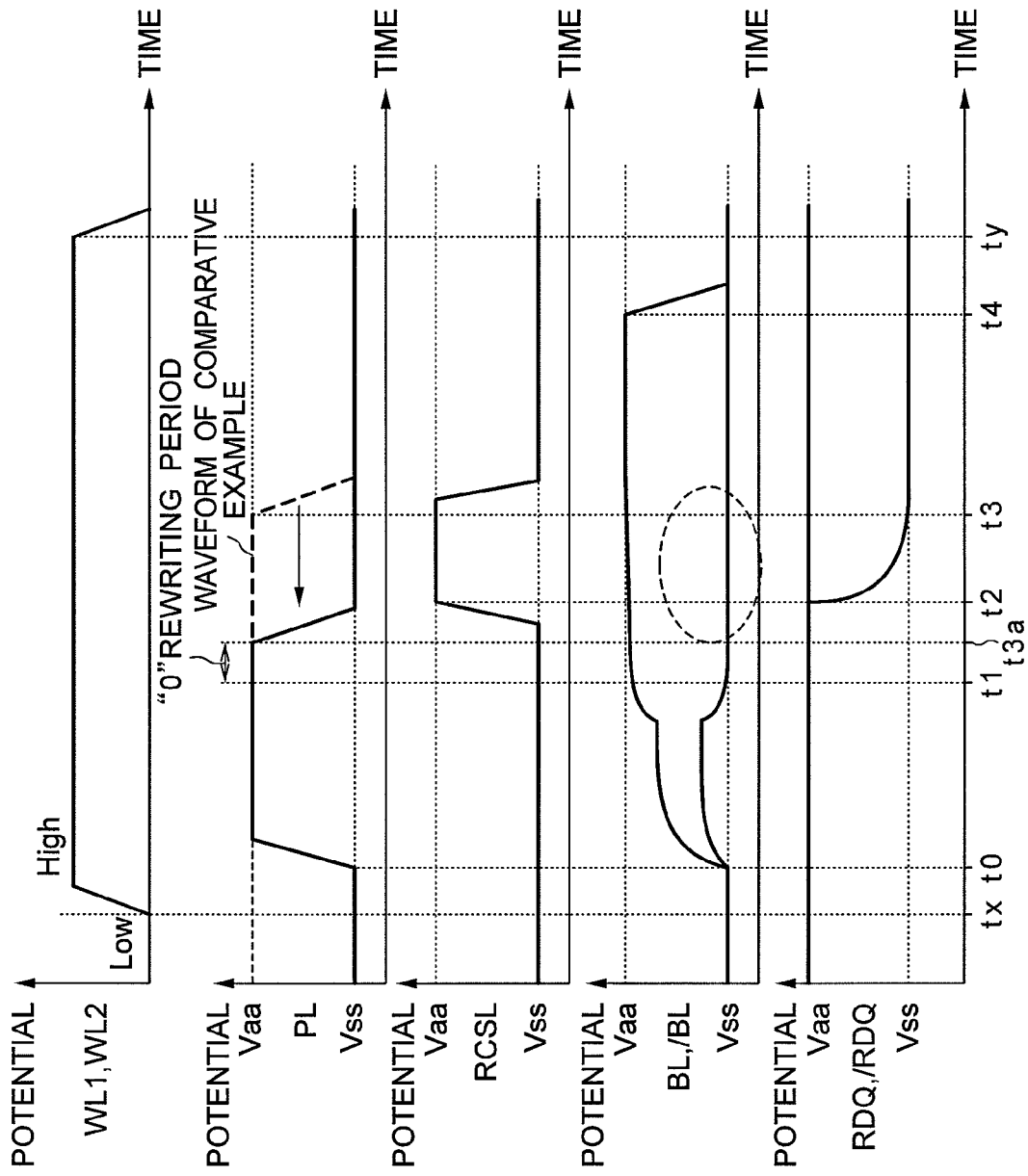
FIG. 4 is a timing chart showing waveforms in the cycle of the reading operation of the ferroelectric random access memory device 100 shown in FIG. 3.

FIG. 4 is a timing chart showing waveforms in the cycle of the reading operation of the ferroelectric random access memory device 100 shown in FIG. 3.

As shown in FIG. 4, in the initial state (a state after the completion of writing), the bit lines BL and /BL and the first and second output lines /RDQ and RDQ are precharged to the ground potential Vaa.

A 2T/2C operation will be described below. In the 2T/2C operation, 1-bit data is held using the two ferroelectric capacitors C1 and C2 and the inverted data of C1 is written in C2.

First, the potentials of the first and second word lines WL1 and WL2 are increased from "Low" level (the ground potential Vss) to "High" level (the power supply potential Vaa). Thus the first and second selecting MOS transistors M1T and M2T are turned on (at time tx).

Next, the potentials of the first and second plate lines PL and /PL are controlled from the ground potential Vss to the power supply potential Vaa, so that potentials corresponding to the data stored in the memory cells M1 and M2 are read to the bit lines BL and /BL (from time t0). At this point, in the memory cell fed with a voltage in a direction along which inverted data is written, the stored data is corrupted. However, the data corrupted by reading is recovered by rewriting "0" and rewriting "1", which will be described later.

Next, the sense amplifier SA amplifies a potential difference between the first and second bit lines BL and /BL to a predetermined level (at time t1). In other words, for example, the first bit line BL is changed to a first data potential according to first data stored in the first ferroelectric capacitor C1 and the second bit line /BL is changed to a second data potential according to second data obtained by inverting the logic of the first data. The first data potential is one of the power supply potential and the ground potential and the second data potential is the other of the power supply potential and the ground potential.

At time t1, the first and third MOS transistors T1 and T3 are controlled to be turned on/off according to the potentials of the first and second bit lines BL and /BL.

Next, the second MOS transistor T2 and the fourth MOS transistor T4 are turned on by raising the potential of the control line RCSL (at time t2). Thus one of the first and second output lines /RDQ and RDQ is electrically connected to the ground 2b and is discharged to the ground potential Vss.

In other words, when the potential of the first bit line BL is the power supply potential Vaa and the potential of the second bit line /BL is the ground potential Vss, the first output line /RDQ is discharged to the ground potential Vss at time t2. When the potential of the first bit line BL is the ground potential Vss and the potential of the second bit line /BL is the power supply potential Vaa, the second output line RDQ is discharged to the ground potential Vss.

In this way, potentials corresponding to the potentials of the first and second bit lines BL and /BL are transmitted to the first and second output lines /RDQ and RDQ (from time t2).

Further, the potentials of the first and second output lines /RDQ and RDQ are outputted from the output terminals 1a and 1b as signals corresponding to the data read from the first and second memory cells M1 and M2. Amplification and maintenance of the potentials of the first and second output lines /RDQ and RDQ are started by another sense amplifier (not shown) at time t3 (from time t2 to at least a time when the potential of the control line RCSL becomes "Low" level). After that, the signals of the output terminals 1a and 1b are read. The another sense amplifier is a circuit for SRAM which is similar to the sense amplifier SA used for amplifying the potential of the bit line.

On the other hand, the first and second bit lines BL and /BL are controlled to the power supply potential Vaa and the ground potential Vss or to the ground potential Vss and the power supply potential Vaa by driving the sense amplifier SA. Further, in a period during which the potential of the plate line is the power supply potential Vaa (from time t1 to time t3a), "0" is rewritten in the memory cell where data "0" has been stored.

After that, the potential of the first plate line PL is reduced to the ground potential Vss in, for example, a state in which the sense amplifier SA is driven, so that rewriting of "1" is started in the memory cell where data "1" has been stored (from time t3a). Rewriting of "1" continues until the sense amplifier SA is deactivated and the first and second bit lines BL and /BL are both reduced to Vss (until time t4).

As described above, the reading cycle of the ferroelectric random access memory device 100 is made up of three independent operations of reading, rewriting of "0", and rewriting of "1".

In this case, a through path is not present between the first and second bit lines BL and /BL and the first and second output lines /RDQ and RDQ (insulated by at least the gate insulating films of the MOS transistors).

Thus when the first and second output lines /RDQ and RDQ are discharged and the signals of the first and second bit lines BL and /BL are transmitted to the first and second output lines /RDQ and RDQ, the signals of the first and second bit lines BL and /BL are not raised from the ground potential Vss. In other words, it is possible to prevent an increase in the potentials of the bit lines unlike in the range surrounded by the dotted line of FIG. 2 in the comparative example.

Hence, the timing of the reduction in the potential of the first plate line PL can be advanced to a time when a time period for writing "0" hardly remains (in FIG. 4, from time t3 to time t3a). Alternatively, the timing of the reduction in the potential of the first plate line PL can be advanced so as to completely eliminate the time for writing "0". In other words, the time period of the reading cycle is further shortened.

As described above, the ferroelectric random access memory device of the present embodiment can further shorten the cycle of the reading operation of a ferroelectric random access memory.

[Second Embodiment]

A second embodiment will describe an example of a ferroelectric random access memory device. The second embodiment is different from the first embodiment in the configuration of a reading circuit.

Figure 5:
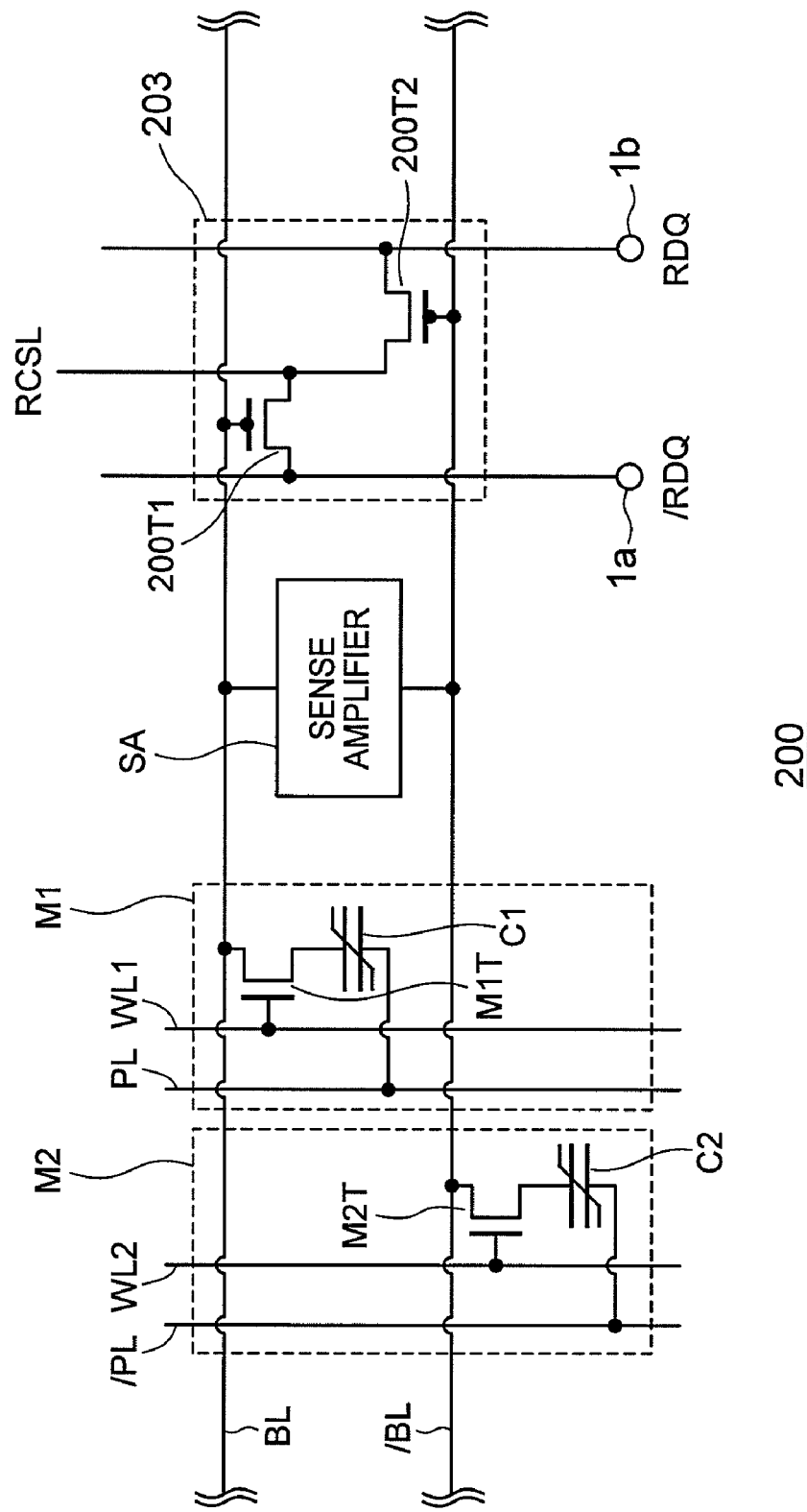
FIG. 5 is a circuit diagram showing an example of the configuration of a ferroelectric random access memory device 200 according to the second embodiment of the present invention.

FIG. 5 is a circuit diagram showing an example of the configuration of a ferroelectric random access memory device 200 according to the second embodiment of the present invention. In FIG. 5, configurations indicated by the same reference numerals as the configurations of FIG. 3 denote the same configurations as the ferroelectric random access memory device 100 of the first embodiment.

As shown in FIG. 5, the ferroelectric random access memory device 200 includes a first output terminal 1a, a second output terminal 1b, a first bit line BL, a second bit line /BL, a first memory cell M1, a second memory cell M2, a sense amplifier SA, and a reading circuit 203.

The ferroelectric random access memory device 200 is different from the ferroelectric random access memory device 100 of the first embodiment in the configuration of the reading circuit 203. The other configurations of the ferroelectric random access memory device 200 are similar to the configurations of the ferroelectric random access memory device 100.

The reading circuit 203 includes a first MOS transistor 200T1, a second MOS transistor 200T2, a control line RCSL, a first output line /RDQ, and a second output line RDQ.

The first output line /RDQ is connected to the first output terminal 1a.

The second output line RDQ is connected to the second output terminal 1b.

The first MOS transistor 200T1 is connected between the first output line /RDQ and the control line RCSL and has the gate connected to the first bit line BL.

The second MOS transistor 200T2 is connected between the second output line RDQ and the control line RCSL and has the gate connected to the second bit line /BL.

In this configuration, the first and second MOS transistors 200T1 and 200T2 are controlled to be turned on/off according to the potentials of the first and second bit lines BL and /BL. When a predetermined potential difference occurs between the first and second bit lines BL and /BL, only one of the first and second MOS transistors 200T1 and 200T2 is turned on. Thus one of the first and second output lines /RDQ and RDQ is electrically connected to the control line RCSL.

By changing the potential of the control line RCSL from a power supply potential Vaa to a ground potential Vss, the output line electrically connected to the control line RCSL is discharged to the ground potential Vss.

Figure 6:
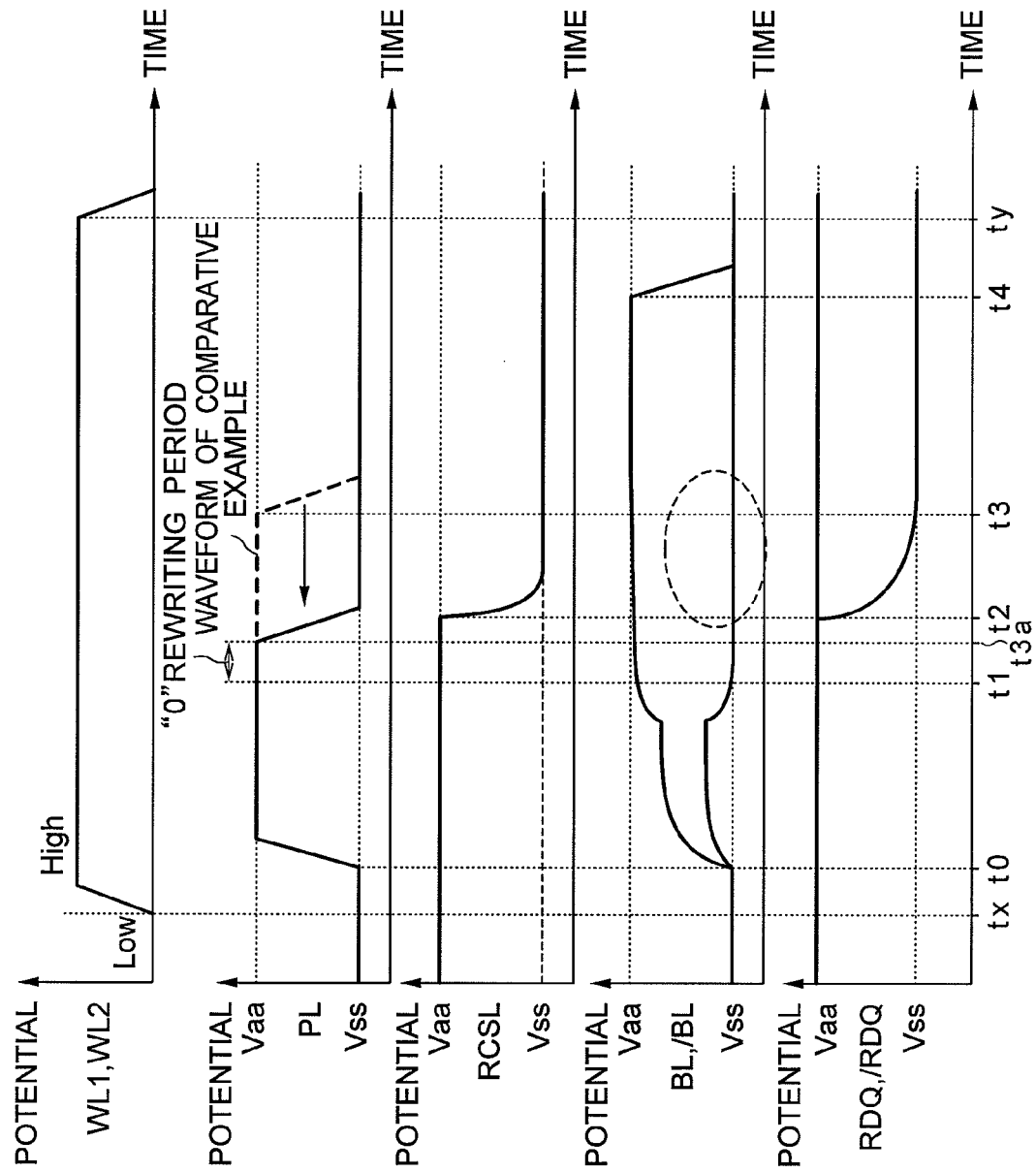
FIG. 6 is a timing chart of waveforms in the cycle of the reading operation of the ferroelectric random access memory device 200 shown in FIG. 5.

The following will describe an example of the reading operation (2T/2C operation) of the ferroelectric random access memory device 200 configured thus. FIG. 6 is a timing chart of waveforms in the cycle of the reading operation of the ferroelectric random access memory device 200 shown in FIG. 5.

As shown in FIG. 6, in the initial state (a state after the completion of writing), the bit lines BL and /BL, the first and second output lines /RDQ and RDQ, and the control line RCSL are precharged to the ground potential Vaa.

First, as in the first embodiment, the potentials of the first and second word lines WL1 and WL2 are increased from "Low" level (the ground potential Vss) to "High" level (the power supply potential Vaa). Thus the first and second selecting MOS transistors M1T and M2T are turned on (at time tx).

Next, the potentials of the first and second plate lines PL and /PL are controlled from the ground potential Vss to the power supply potential Vaa, so that potentials corresponding to data stored in memory cells M1 and M2 are read to the bit lines BL and /BL (from time t0). At this point, in the memory cell fed with a voltage in a direction along which inverted data is written, the stored data is corrupted. However, as in the first embodiment, the data corrupted by reading is recovered by rewriting "1".

Next, as in the first embodiment, the sense amplifier SA amplifies a potential difference between the first and second bit lines BL and /BL to a predetermined level (at time t1).

In other words, for example, in a state in which the potential of the control line RCSL is set at a first control potential (the power supply potential Vaa), the first bit line BL is changed to a first data potential according to first data stored in a first ferroelectric capacitor C1 and the second bit line /BL is changed to a second data potential according to second data obtained by inverting the logic of the first data.

The first data potential is one of the power supply potential and the ground potential and the second data potential is the other of the power supply potential and the ground potential.

At time t1, the first and second MOS transistors 200T1 and 200T2 are controlled to be turned on/off according to the potentials of the first and second bit lines BL and /BL. Thus one of the first and second bit lines BL and /BL is electrically connected to the control line RCSL.

Next, the potential of the control line RCSL is changed from the first control potential (the power supply potential Vaa) to a second control potential (the ground potential Vss) lower than the first control potential (at time t2). Thus the output line electrically connected to the control line RCSL is discharged to the ground potential Vss.

In other words, when the potential of the first bit line BL is the power supply potential Vaa and the potential of the second bit line /BL is the ground potential Vaa, the first output line /RDQ is discharged to the ground potential Vss at time t2. When the potential of the first bit line BL is the ground potential Vss and the potential of the second bit line /BL is the power supply potential Vaa, the second output line RDQ is discharged to the ground potential Vss.

In this way, potentials corresponding to the potentials of the first and second bit lines BL and /BL are transmitted to the first and second output lines /RDQ and RDQ (from time t2). Thus the potentials are outputted from the output terminals 1a and 1b as signals corresponding to the data read from the first and second memory cells M1 and M2.

Further, as in the first embodiment, the potentials of the first and second output lines /RDQ and RDQ are amplified and kept by another sense amplifier (not shown). After that, the signals of the output terminals 1a and 1b are read.

In a period during which the first and second bit lines BL and /BL are controlled to the power supply potential Vaa and the ground potential Vss or to the ground potential Vss and the power supply potential Vaa by driving the sense amplifier SA (from time t1 to time t3a), "0" is rewritten in the memory cell where data "0" has been stored.

After that, the potential of the first plate line PL is reduced to the ground potential Vss in, for example, a state in which the sense amplifier SA is driven, so that rewriting of "1" is started in the memory cell where data "1" has been stored (from time t3a). Rewriting of "1" continues until the sense amplifier SA is deactivated and the first and second bit lines BL and /BL are both reduced to Vss (until time t4).

As described above, the reading cycle of the ferroelectric random access memory device 200 is made up of three independent operations of reading, rewriting of "0", and rewriting of "1".

In this case, a through path is not present between the first and second bit lines BL and /BL and the first and second output lines /RDQ and RDQ (insulated by at least the gate insulating films of the MOS transistors).

Thus when the first and second output lines /RDQ and RDQ are discharged and the signals of the first and second bit lines BL and /BL are transmitted to the first and second output lines /RDQ and RDQ, the signals of the first and second bit lines BL and /BL are not raised from the ground potential Vss. In other words, it is possible to prevent an increase in the potential of the bit line unlike in the range surrounded by the dotted line of FIG. 2 in the comparative example.

Hence, the timing of the reduction in the potential of the first plate line PL can be advanced to a time when a time period for writing "0" hardly remains (in FIG. 6, from time t3 to time t3a) or is completely eliminated. In other words, the time period of the reading cycle is further shortened.

As described above, the ferroelectric random access memory device of the present embodiment can further shorten the cycle of the reading operation of a ferroelectric random access memory by eliminating rewriting of "0".

In the foregoing embodiments, the first plate line and the second plate line are separately provided. However, the first plate line and the second plate line may be connected in common.

The foregoing embodiments described a 2T/2C operation in which complementary (inverted) data is written in the first memory cell M1 and the second memory cell M2 and 1-bit data is held in the two cells. The present invention is also applicable to a 1T/1C operation in which 1-bit data is held in a single cell.

For example, in a state in which the potential of the second word line WL2 is fixed at "Low" level and the second selecting MOS transistor is turned off, a reference potential shared from a dummy capacitor, a dummy ferroelectric capacitor, or a power supply may be applied to the second bit line /BL.

The reference potential is determined to be an intermediate potential of a bit line potential corresponding to "1" and a bit line potential corresponding to "0".

Also in this case, as in FIGS. 4 and 6, the sense amplifier controls the first and second bit lines BL and /BL to a potential corresponding to data stored in the first ferroelectric capacitor C1 of the first memory cell M1. Further, by controlling the control line RCSL, a signal corresponding to data stored in the first ferroelectric capacitor C1 of the first memory cell M1 is outputted to the first and second output terminals 1a and 1b.

What is claimed is:

1. A ferroelectric random access memory device, comprising:
   a first bit line;
   a second bit line;
   a first ferroelectric memory cell connected between the first bit line and a first plate line;
   a second ferroelectric memory cell connected between the second bit line and a second plate line;
   a sense amplifier connected between the first bit line and the second bit line, and configured to amplify a potential difference between the first bit line and the second bit line;
   a first output terminal;
   a second output terminal;
   a first output line comprising a first end connected to a power supply and a second end connected to the first output terminal;
   a second output line comprising a first end connected to the power supply and a second end connected to the second output terminal;

a first Metal Oxide Semiconductor (MOS) transistor connected between the first output line and ground, and comprising a gate connected to the first bit line;
a second MOS transistor connected in series with the first MOS transistor between the first output line and the ground;
a third MOS transistor connected between the second output line and the ground, and comprising a gate connected to the second bit line; and
a fourth MOS transistor connected in series with the third MOS transistor between the second output line and the ground,
wherein the first bit line is set to a first data potential according to first data stored in the first ferroelectric memory cell, the second bit line is set to a second data potential according to second data which are logical inversion of the first data, and
the second MOS transistor and the fourth MOS transistor are turned on.

2. The ferroelectric random access memory device of claim 1, further comprising:
a fifth MOS transistor connected between the power supply and the first output line, comprising a gate connected to the ground, and being a positive-type (p-type) MOS transistor; and
a sixth MOS transistor connected between the power supply and the second output line, comprising a gate connected to the ground, being a p-type MOS transistor,
wherein the first MOS transistor, the second MOS transistor, the third MOS transistor, and the fourth MOS transistor are negative type (n-type) MOS transistors.

3. The ferroelectric random access memory device of claim 2, wherein the first MOS transistor, the second MOS transistor, the third MOS transistor, and the fourth MOS transistor are larger in size than the fifth MOS transistor and the sixth MOS transistor.

4. The ferroelectric random access memory device of claim 2, wherein the fifth MOS transistor and the sixth MOS transistor are substantially equal in size.

5. The ferroelectric random access memory device of claim 3, wherein the fifth MOS transistor and the sixth MOS transistor are substantially equal in size.

6. The ferroelectric random access memory device of claim 1, wherein the first data potential is one of a power supply potential and a ground potential, and
the second data potential is the other of the power supply potential and the ground potential.

7. The ferroelectric random access memory device of claim 2, wherein the first data potential is one of a power supply potential and a ground potential, and
the second data potential is the other of the power supply potential and the ground potential.

8. The ferroelectric random access memory device of claim 3, wherein the first data potential is one of a power supply potential and a ground potential, and
the second data potential is the other of the power supply potential and the ground potential.

9. The ferroelectric random access memory device of claim 4, wherein the first data potential is one of a power supply potential and a ground potential, and
the second data potential is the other of the power supply potential and the ground potential.

10. The ferroelectric random access memory device of claim 5, wherein the first data potential is one of a power supply potential and a ground potential, and
the second data potential is the other of the power supply potential and the ground potential.

11. A ferroelectric random access memory device, comprising:
a first bit line;
a second bit line;
a first ferroelectric memory cell connected between the first bit line and a first plate line;
a second ferroelectric memory cell connected between the second bit line and a second plate line;
a sense amplifier connected between the first bit line and the second bit line, and configured to amplify a potential difference between the first bit line and the second bit line;
a first output terminal;
a second output terminal;
a first output line connected to the first output terminal;
a second output line connected to the second output terminal;
a first Metal Oxide Semiconductor (MOS) transistor connected between the first output line and a control line, and comprising a gate connected to the first bit line; and
a second MOS transistor connected between the second output line and the control line, and comprising a gate connected to the second bit line,
wherein the first bit line is set to a first data potential according to first data stored in the first ferroelectric memory cell, the second bit line is set to a second data potential according to second data which are logical inversion of the first data in a state in which a potential of the control line is set at a first control potential, and
the potential of the control line is changed from the first control potential to a second control potential lower than the first control potential.

12. The ferroelectric random access memory device of claim 11, wherein the first control potential is a power supply potential, and
the second control potential is a ground potential.

13. The ferroelectric random access memory device of claim 11, wherein the first data potential is one of a power supply potential and a ground potential, and
the second data potential is the other of the power supply potential and the ground potential.

14. The ferroelectric random access memory device of claim 12, wherein the first data potential is one of a power supply potential and a ground potential, and
the second data potential is the other of the power supply potential and the ground potential.

15. The ferroelectric random access memory device of claim 1,
wherein the first ferroelectric memory cell is a first ferroelectric capacitor connected between the first bit line and the first plate line, the first ferroelectric capacitor configured to store data according to a first applied voltage and a polarization state determined by a polarity of the first applied voltage, and
wherein the second ferroelectric memory cell is a second ferroelectric capacitor connected between the second bit line and the second plate line, the second ferroelectric capacitor configured to store data according to a second applied voltage and a polarization state determined by a polarity of the second applied voltage.

16. The ferroelectric random access memory device of claim 11,
wherein the first ferroelectric memory cell is a first ferroelectric capacitor connected between the first bit line and the first plate line, the first ferroelectric capacitor configured to store data according to a first applied voltage and a polarization state determined by a polarity of the first applied voltage, and wherein the second ferroelectric memory cell is a second ferroelectric capacitor connected between the second bit line and the second plate line, the second ferroelectric capacitor configured to store data according to a second applied voltage and a polarization state determined by a polarity of the second applied voltage.

* * * * *